United States Patent
Tsai et al.

(10) Patent No.: US 6,215,306 B1
(45) Date of Patent: Apr. 10, 2001

(54) MAGNETIC RESONANCE IMAGING USING OFF-CENTERED SPIRAL TRAJECTORIES

(75) Inventors: Chi-Ming Tsai; Lai-Chee Man, both of Stanford, CA (US)

(73) Assignee: Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/312,029

(22) Filed: May 14, 1999

(51) Int. Cl.[7] .................................................. G01V 3/00

(52) U.S. Cl. ..................................... 324/309; 324/307

(58) Field of Search .................................. 324/309, 307, 324/306, 312, 314, 318, 300

(56) References Cited

U.S. PATENT DOCUMENTS

| | | | |
|---|---|---|---|
| 5,192,909 | * | 3/1993 | Hardy et al. .......................... 324/309 |
| 5,604,435 | * | 2/1997 | Foo et al. ............................. 324/309 |
| 5,892,358 | * | 4/1999 | King ..................................... 324/309 |

OTHER PUBLICATIONS

Chi–Ming Tsai and Lai–Chee Man, Abstract of "Magnetic Resonance Imaging Using Off–Centered Spiral Trajectories", Proceedings of the ISMRM seventh Scientific Meeting, p. 1637, 1999.

* cited by examiner

*Primary Examiner*—Louis Arana
(74) *Attorney, Agent, or Firm*—Townsend and Townsend and Crew LLP; Henry K. Woodward

(57) ABSTRACT

The quality of spiral images depends on whether actual k-space sampling points are at their nominal positions. Although newer gradient systems can provide more accurate gradient waveforms, timing mis-registration between data acquisition and gradient systems can significantly distort the positions of samples. Even after the timing of data acquisition is tuned, minor residual errors can still cause shading artifacts which are problematic for quantitative MRI applications, such as the phase-contrast method. Although ideally measuring the actual k-space trajectory can correct for the timing errors, it requires additional data acquisition and scan time. The present invention employs off-centered spiral trajectories which are more robust against timing errors and applies them to the phase-contrast method. The new trajectories turn shading artifacts into a slowly-varying linear phase in reconstructed images without affecting the magnitude of images.

10 Claims, 5 Drawing Sheets

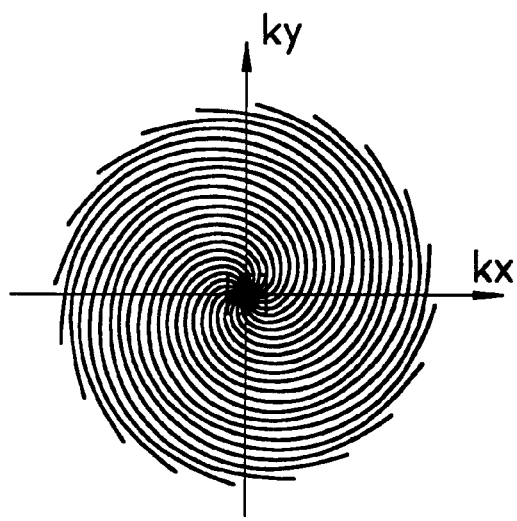
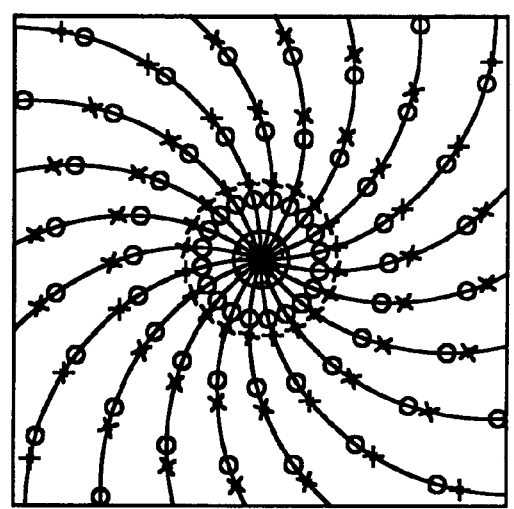
*FIG. 1A*  *FIG. 1B*
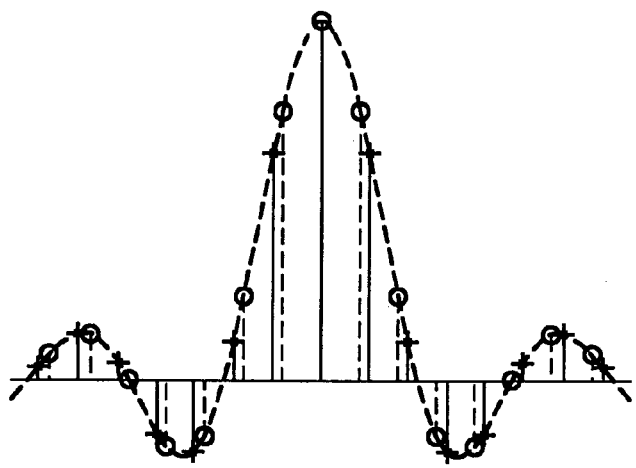
*FIG. 2A*
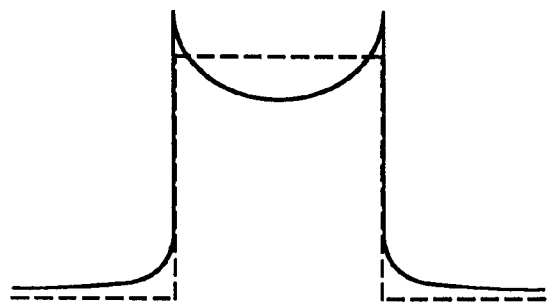
*FIG. 2B*

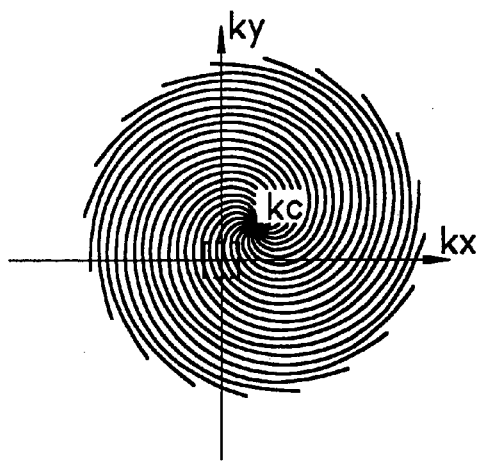
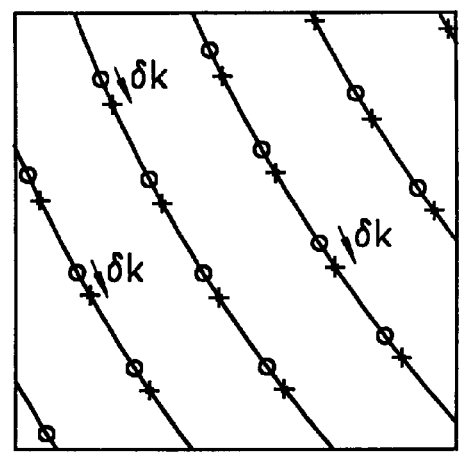
FIG. 3A  FIG. 3B
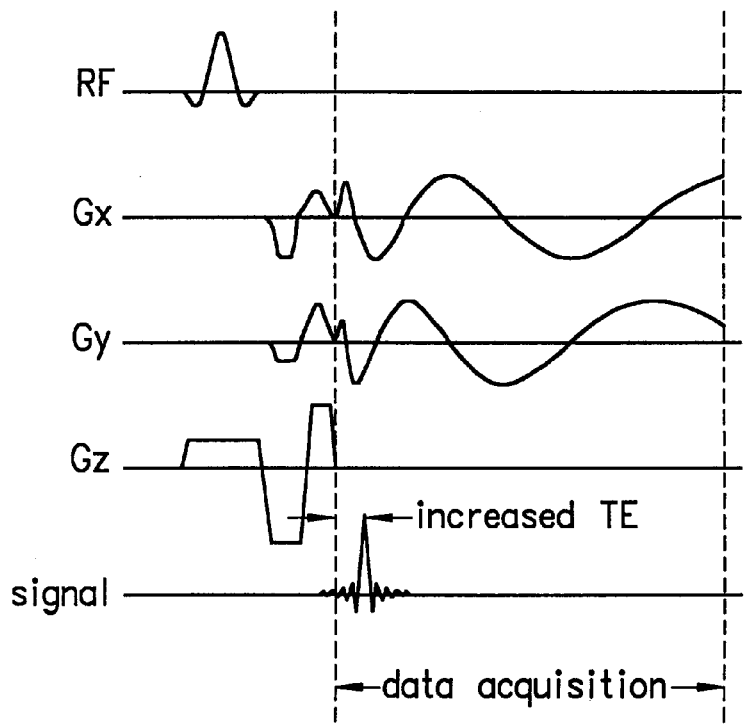
FIG. 4

MAGNETIC RESONANCE IMAGING USING OFF-CENTERED SPIRAL TRAJECTORIES

STATEMENT AS TO RIGHTS TO INVENTIONS MADE UNDER FEDERALLY SPONSORED RESEARCH AND DEVELOPMENT

The U.S. Government has rights in this invention pursuant to NIH grant No. HL56394 to Stanford University.

BACKGROUND OF THE INVENTION

This invention relates generally to magnetic resonance imaging (MRI), and more particularly the invention relates to the use of k-space spiral trajectories in acquiring MRI data.

The invention will be described with reference to publications listed in the attached appendix.

MRI signals for reconstructing an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins. The detected signals can be envisioned as traversing lines in a Fourier transformed space (k-space) with the lines aligned in spaced parallel Cartesian trajectories and in spiral trajectories emanating from an origin in k-space.

Spiral trajectories (1) not only have been extensively used in fast MRI imaging, but also were increasingly applied to quantitative applications, such as functional MRI (2,3), spectroscopy (4), apparent diffusion coefficient measurement (5) and flow quantitation using the phase-contrast (PC) method (6,7).

The quality of reconstructed spiral images depends on whether the actual k-space sampling points are at their nominal positions (8). To obtain accurate sampling positions, high-fidelity gradient waveforms must be generated, and data acquisition must be precisely synchronized with the gradient systems. Although newer gradient systems can provide more accurate gradient waveforms, timing mis-registration between data acquisition and gradient systems can significantly degrade the accuracy of sampling positions. The anti-aliasing filter introduces an additional delay to the data acquisition system. As a result, delays have been a very common source of k-space trajectory distortion (9). Although these delays can be partly compensated in pulse sequence programming, it is difficult to totally correct for these delays because they are usually different in the three physical axes. Furthermore, the hardware imposes restrictions on the timing positions of gradient waveforms and data acquisition. For example, on our scanner, the temporal resolutions of gradient waveforms and data acquisition are 4-$\mu$s and 1-$\mu$s, respectively. Those uncompensated delays shift the echo time and merely generate a linear phase in a conventional 2DFT image, but they cause more significant artifacts with other k-space trajectories. One well-known example is echo-planar imaging (EPI) (10), where ghosts appear when the readout gradient and data acquisition are not aligned. For spiral imaging, such delays may significantly degrade image quality if they are not carefully tuned. Even on a scanner whose delays have been adjusted, we found that the minor residual delays may still cause shading artifacts which are problematic for quantitative applications.

Because an ideal k-space trajectory is difficult to achieve, several methods to measure the actual trajectory have been proposed in the literature (8,9,11–15). Such a measurement usually needs to be performed whenever the image orientation is changed. To avoid repetitive measurements, Kerr et al. (16) assumes that each gradient system is a linear system and can be modeled with a transfer function. The advantage of this method is that the characterization procedure is done only once. Although using the measured k-space trajectories in reconstruction improves image quality, the accuracy of the measured trajectories is limited by noise and assumptions made in the modeling of those methods.

SUMMARY OF THE INVENTION

In accordance with the present invention, we introduce, off-centered spiral trajectories to solve the delay-related problems. We apply the new trajectories to the PC method to demonstrate how the delays may affect quantitative results. After slightly shifting the whole spiral trajectory away from the k-space origin, we found that reconstructed images are less sensitive to uncompensated delays. Consequently, the spiral trajectories can be more reliably used in quantitative applications without the need for measuring actual trajectories.

The invention and objects and features thereof will be more readily apparent from the following description and appended claims when taken with the drawings.

BRIEF DESCRIPTION OF THE DRAWINGS

FIGS. 1(a),1(b) illustrate a spiral trajectory and effects of a 1-$\mu$s data acquisition delay.

FIGS. 2(a),2(b) illustrate ideal samples and erroneous samples on a sinc function signal and reconstructed images of the samples.

FIG. 3(a),3(b) illustrate an off-centered spiral trajectory and the effects of a 1-$\mu$s data acquisition delay.

FIG. 4 illustrates gradient waveforms (Gx,Gy) corresponding to one interleaf of the spiral trajectory in FIG. 3(a).

DETAILED DESCRIPTION OF ILLUSTRATIVE EMBODIMENTS

Figure 5A:
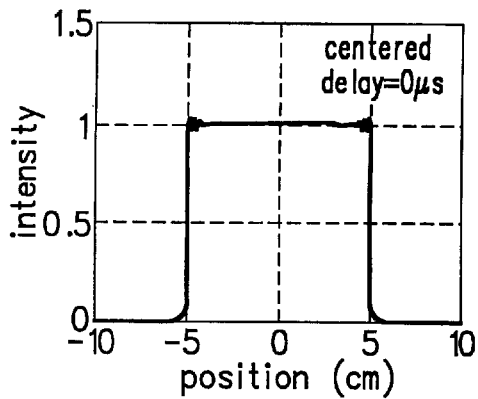
FIGS. 5(a)–5(d) illustrate intensity profiles of a large disk with four different sampling patterns: (a) S(k), (b) S'(k), (c) S(k)+$k_c$, and (d) S'(k)+$k_c$.
Figure 5C:
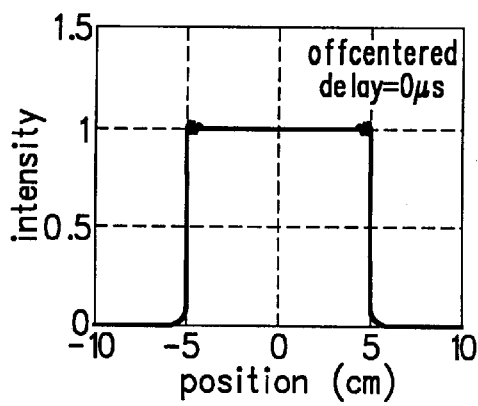
Figure 5B:
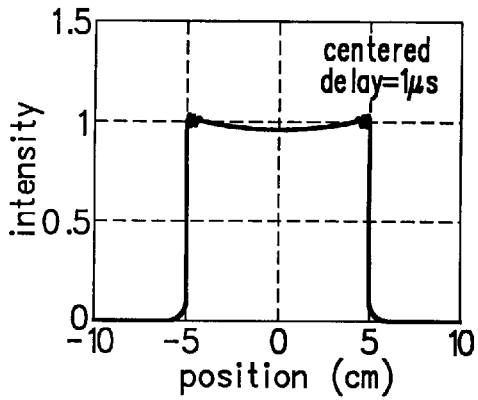
Figure 5D:
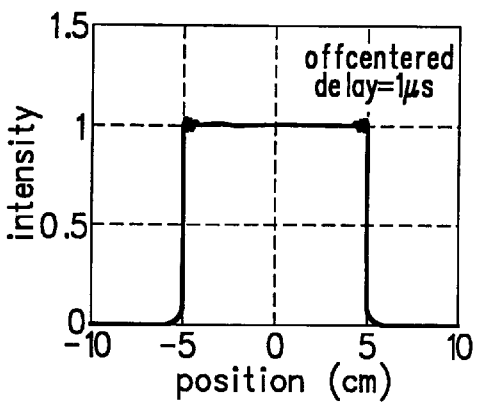

Uncompensated delays distort actual sampling positions on k-space spirals, and any errors in sampling positions result in errors in sampled values. Qualitatively samples around the k-space origin contain larger errors in their values because the k-space data of an image usually has a sharp peak around the origin. Therefore, the effects of delays in reconstructed images depend primarily on how delays affect samples around the k-space origin.

For a centered spiral trajectory as in FIG. 1a, the delays cause mainly a radial contraction or expansion of samples around the k-space origin depending on whether data acquisition is ahead of or behind the actual gradient waveforms.

FIG. 1b plots the ideal sampling positions S(k) (circles), k=[$k_x$, $k_y$], and the actual sampling positions S'(k) (stars) around the origin when data acquisition is one quarter of the sampling time behind the gradient waveforms. A radial expansion is the main effect of delays on these samples. FIG. 2a illustrates how samples are affected quantitatively by the expansion with a one-dimensional example where a sinc function whose Fourier transform is a rectangular object is sampled. The ideal samples and the erroneous samples, which are relatively stretched by one quarter of the sampling interval, are marked with circles and stars, respectively. Because errors of sampled values around the origin have larger amplitude, low-frequency shading artifacts dominate the errors of the reconstructed image shown in FIG. 2b.

To remove the shading artifacts, we shift the whole trajectory by $k_c$ as in FIG. 3a. Given the same amount of delay time as in FIG. 1b, FIG. 3b plots the ideal positions S(k)+$k_c$ (circles) and the actual positions S'(k)+$k_c$ (stars) of samples around the k-space origin. The delays shift these samples approximately along the same direction by $\delta k$ which is about one quarter of the sampling interval along the trajectory. Such a parallel shift generates merely a slowly-varying linear phase in reconstructed images without affecting the magnitude. The displacement $k_c$ should be chosen such that the effects of delays on samples around the origin can be approximated by a parallel shift as in FIG. 3b. In practice, we shifted the whole trajectory by about 5% of the diameter of the sampled region for our interleaved spiral trajectories.

The corresponding readout gradient waveforms of the off-centered spiral trajectory are plotted in FIG. 4. The new gradient waveforms are exactly the same as the original waveforms except for the initial bipolar blips whose net areas are determined by $k_c$. The purpose of using bipolar gradients is to achieve flow compensation, however, a unipolar gradient can be used if there is no flowing material in the excited slice. These bipolar gradients are designed such that the first moments of the whole waveforms are equal to zero when the trajectory traverses the k-space origin. Additionally, the minimum TE is increased by the interval from the beginning of data acquisition to the time the trajectory passes through the k-space origin, an interval which is less than 1 ms in our implementation. The initial bipolar blips usually do not increase minimum TE because they can overlap in time with the refocusing gradient in the slice-selection direction.

Although the new trajectory is off-centered, the griding image reconstruction method (1,17) can still be applied. The images are reconstructed as if the samples were acquired using the centered trajectories. Thereafter, the linear phase due to the shift $k_c$ can be corrected in the reconstructed images. In the presence of $B_0$ inhomogeneity, the off-centered spiral trajectories again add only a linear phase due to the shift $k_c$ to the blurred point-spread-function (18), but have no additional observable effect on resultant images according to our simulations and acquired images. Therefore, a simple $B_0$ correction scheme (19) can be applied.

The nominal trajectory S(k) was implemented on a 1.5-T GE Signa wholebody scanner equipped with 40 mT/m, 150 mT/m/ms gradients, but we designed spiral trajectories with a maximum slew-rate of 120 mT/m/ms to reduce potential gradient imperfections. The sampling time of the scanner was 4 $\mu s$.

In simulations parameters of the nominal spiral trajectory S(k) were: 20-cm field-of-view (FOV), 256×256 matrix, 17 interleaves and 14.0-ms readout time. The displacement, $k_c$ was 10 grids (1 grid=1 cycle/FOV) for the off-centered trajectory. A uniform disk of diameter d was used in simulations, and synthesized data were generated for both S(k) and S('k) using 1-$\mu s$ delay in data acquisition. These data were then gridded using S(k) irrespective of the actual trajectory because we assume that the actual trajectory is not measured in our method.

Figure 6:
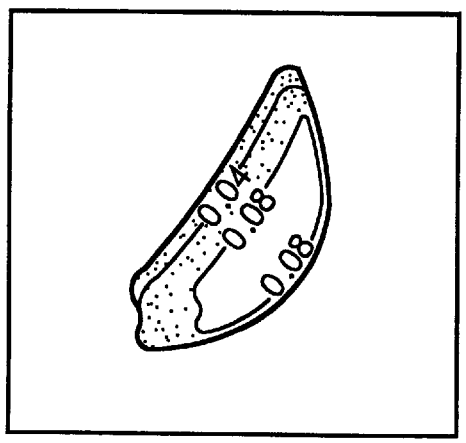
FIG. 6 illustrates a phase map of the image in FIG. 5(d).
Figure 7A:
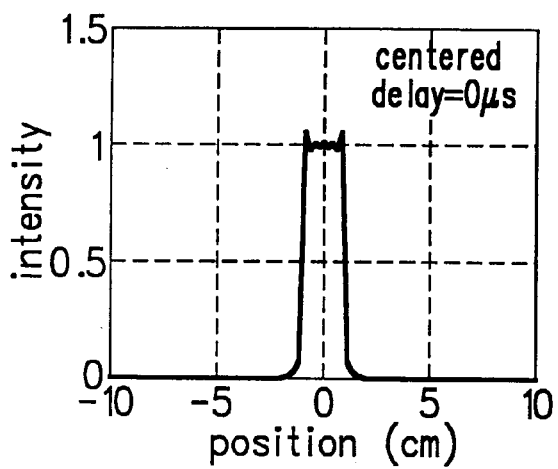
FIGS. 7(a)–7(d) illustrate intensity profiles of a small disk with four different sampling patterns: (a) S(k), (b) S'(k), (c) S(k)+$k_c$, and (d) S'(k)+$k_c$.
Figure 7C:
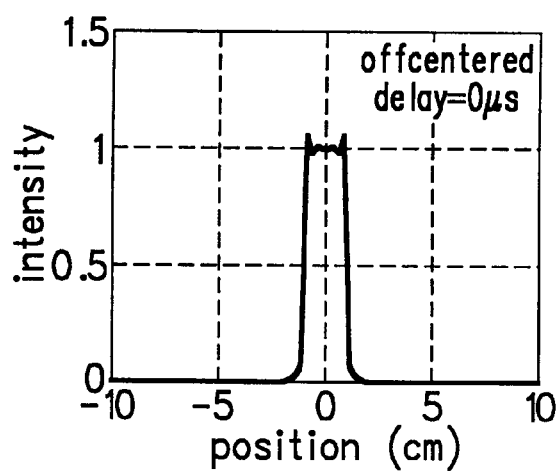
Figure 7B:
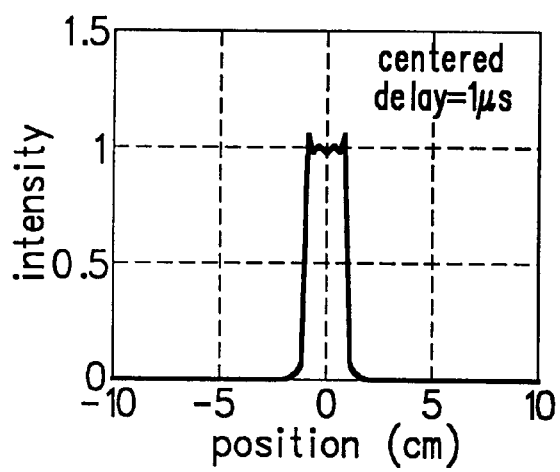
Figure 7D:
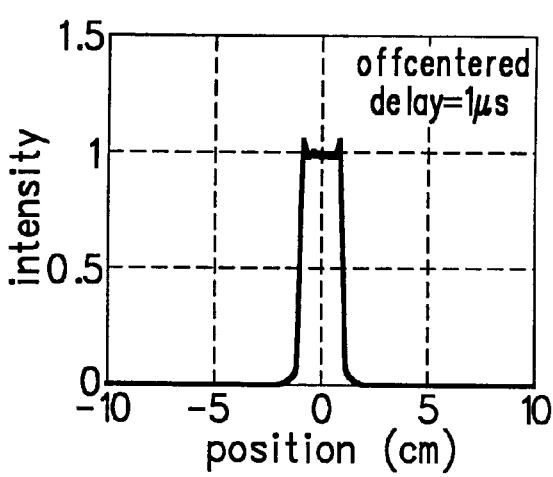

When the disk is large (d=10 cm), the intensity profiles along the diameter of the disk are plotted in FIG. 5. For the centered spiral trajectory, although the intensity profile for S(k) was almost perfect in FIG. 5a, the profile for S('k) had up to 5% shading artifacts in FIG. 5b. For the off-centered spiral trajectory, the 1-$\mu s$ delay had no observable effect in the intensity profile in FIG. 5d, but caused linear phase variations in the phase image shown in FIG. 6, where the phase varies linearly between −0.1 and 0.1 radian. Such small phase variations have no effect on most applications.

A similar simulation was also performed for a 2-cm disk. FIG. 7 plots the intensity profiles obtained by the four sampling patterns: S(k), S'(k), S(k)+$k_c$ and S'(k)+$k_c$. All intensity profiles were very similar because the k-space data of the small disk was a smoother function, and therefore sampled values were insensitive to minor trajectory distortion.

Figures 8A, 8B, 8C:
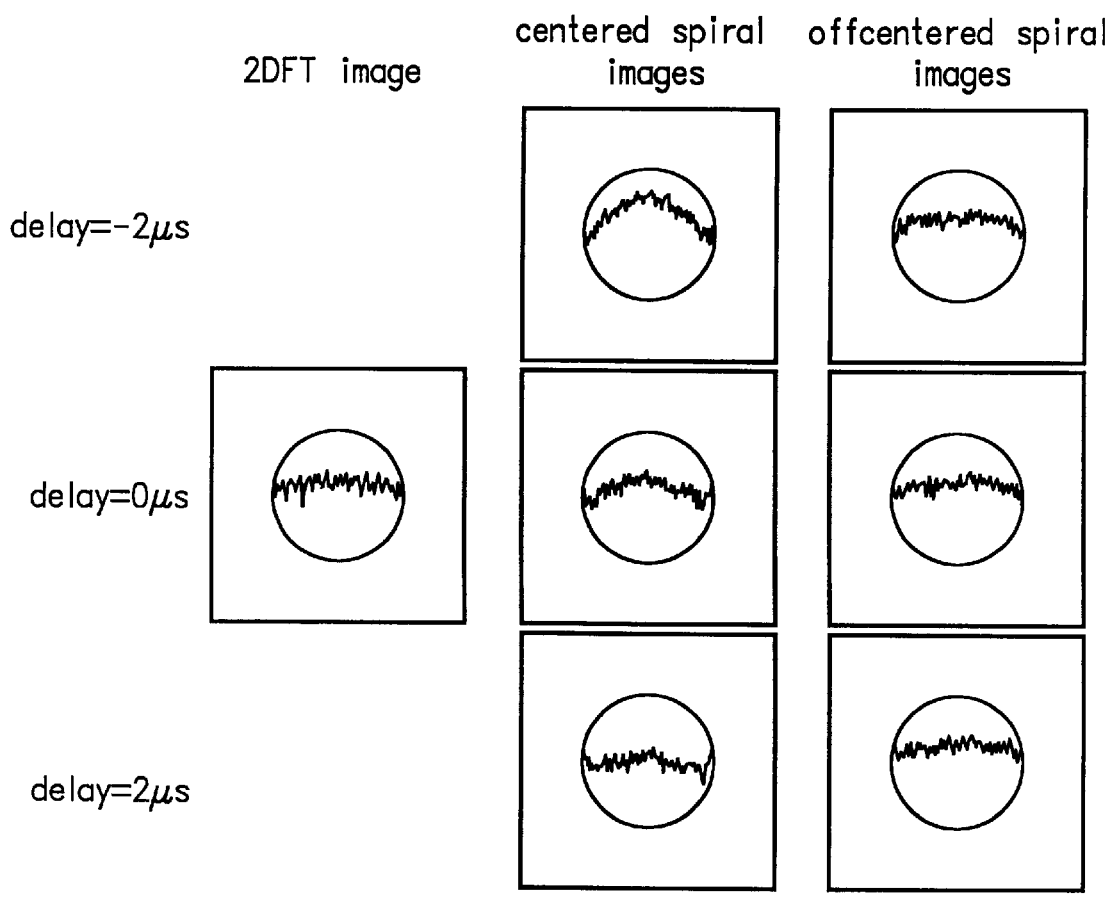
FIGS. 8(a)–8(c) illustrate a 2DFT image of a sphere 8(a) and intensity profiles of three centered spiral images with and without delay 8(b) and three off-centered spiral images with and without delay 8(c).

The same spiral trajectory used in previous simulations was used to acquire images of a 10-cm homogeneous sphere phantom. A gradient-echo (TE/TR/α/slice thickness=10 ms/100 ms/30°/10 mm) 2DFT sequence was used first to acquire a 256×256 reference image (FIG. 8a), and then six spiral images were acquired. The centered spiral trajectory was used to acquire three images (FIG. 8b) with additional data acquisition delays: −2, 0 and 2 $\mu s$. The shading artifacts were obvious and varied with the delays. Then the off-centered spiral trajectory was used to acquire another three images (FIG. 8c) with the same amount of delays. These images appeared very similar, and all three intensity profiles were close to the reference image in FIG. 8a.

Steady flow in a glass tube with an inner diameter of 4.2 mm was measured with the phase-contrast method. The tube was immersed in a box full of water to simulate stationary background. The actual flow rate was 8.33 ml/s which corresponded to a mean flow velocity of 60 cm/s. Parameters of the spiral trajectory used in this experiment were: 32-cm FOV, 512×512 matrix, 69 interleaves and 14.0-ms readout time. The displacement $k_c$ was 20 grids. A gradient-echo sequence (TE/TR/α/slice thickness=10 ms/100 ms/30°/10 mm) with bipolar gradients ($v_{enc}$=200 cm/s) in the slice-selection direction was used to measure the flow velocity.

Figure 9:
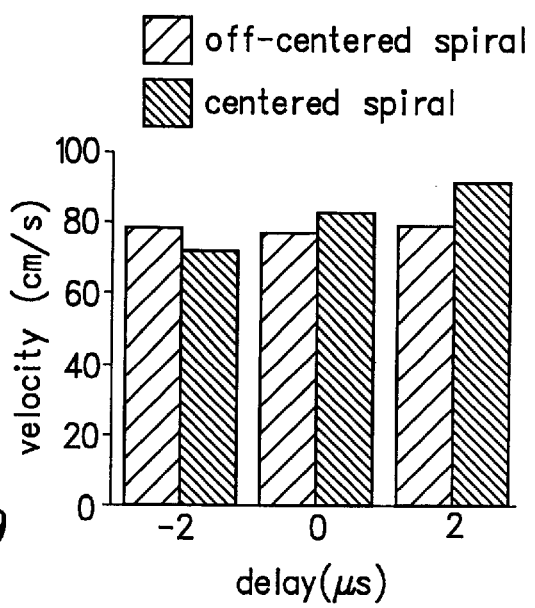
FIG. 9 illustrates mean velocity of nine central pixels with centered (solid) and off-centered (striped) spiral trajectories as a function of data acquisition delay.

FIG. 9 shows the mean velocity of nine central pixels within the tube measured with the centered and the off-centered spiral trajectories with different data acquisition delays: −2, 0 and 2 $\mu s$. For the centered spiral trajectory, the sensitivity of the measured velocities to the data acquisition delay was about 5 cm/s per $\mu s$ delay, while velocities measured with the off-centered spiral trajectory were insensitive to the delay.

The off-centered sampling method can also be applied to projection reconstruction trajectories where timing mis-registration causes the similar shading artifacts. The timing mis-registration problem will be more crucial as the slew rate and the strength of the gradient systems and the sampling frequency of data acquisition increase. For example, a 1 $\mu s$ delay can cause several trajectory distortions on a scanner equipped with a 1-MHz data acquisition system and high performance gradients.

The PC method is more sensitive to the shading artifacts caused by delays than most of the other MRI applications. For many other applications whose desired quantity is a function of the ratio of two measurements (e.g. measurements of $T_1$, and $T_2$), the shading artifacts are mostly cancelled out in post-processing. However, the PC method which calculates the phase difference of two measurements are very sensitive to the shading artifacts. This is because the measured signal within a vessel is the sum of the velocity-encoded flowing spins and the shading artifacts caused by the larger stationary background. The former is little affected by the delays according to FIG. 7, but the latter introduces artificial "partial volume effects" to each pixel within the vessel. Therefore, the flow velocity is underestimated or overestimated depending on the polarity of the delays.

Although the image quality can be improved by adjusting the timing between gradient systems and data acquisition, any minor residual errors still result in shading artifacts and are problematic for quantitative applications. When measuring the actual k-space trajectory is undesired, or the measured trajectory is not sufficiently accurate, the off-centered spiral trajectory is a simple alternative to overcome the delay problems.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

REFERENCES

1. C. H. Meyer, B. S. Hu, D. G. Nishimura, and A. Macovski, Fast spiral coronary artery imaging. *Magn. Reson. Med.* 28, 202–213 (1992).
2. S. Lai and G. H. Glover, Three-dimensional spiral FMRI technique: a comparison with 2D spiral acquisition. *Magn. Reson. Med.* 39, 68–78 (1998).
3. D. C. Noll, J. D. Cohen, C. H. Meyer, and W. Schneider, Spiral k-space MR-imaging of cortical activation, *J. Magn. Reson. Imaging* 5, 49–56 (1995).
4. E. Adalsteinsson, P. Irarrazabal, S. Topp, C. Meyer, A. Macovski, and D. M. Spieman, Volumetric spectroscopic imaging with spiral-based k-space trajectories. *Magn. Reson. Med.* 39, 889–898 (1998).
5. T. Q. Li, A. M. Tahahashi, T. Hindmarsh, and M. E. Moseley, ADC mapping by means of a single-shot spiral MRI technique with application in acute cerebral ischemia. *Magn. Reson. Med.* 41, 143–147 (1999).
6. P. D. Gatehouse, D. N. Firmin, S. Collins, and D. B. Longmore, Real-time blood flow imaging by spiral scan phase-velocity mapping. *Magn. Reson. Med.* 31, 504–512 (1994).
7. G. B. Pike, C. H. Meyer, T. J. Brosnan, and N. J. Pelc, Magnetic-resonance velocity imaging using a fast spiral phase-constrst sequence. *Magn. Reson. Med.* 32, 476–483 (1994).
8. D. M. Spielman and J. M. Pauly, Spiral imaging on a small-bore system at 4.7 T. *Magn. Reson. Med.* 34, 580–585 (1995).
9. Y. Zhang, H. P. Hetherington, E. M. Stokely, G. F. Mason, and D. B. Twieg, A novel k-space trajectory measurement technique. *Magn. Reson. Med.* 39, 999–1004 (1998).
10. J. Pauly, K. Butts, A. Kerr, and A. Macovski, Oblique EPI ghost artifact elimination for real-time interactive imaging, in "Proc., ISMRM, 6th Annual Meeting, Sydney, 1998," p. 422.
11. T. Onodera, S. Matsui, K. Sekihara, and H. Kohno, A method of measuring field-gradient modulation shapes. *J. Phys. E: Sci. Instrum.* 20, 416–419 (1987).
12. A.Takahashi and T. Peters, Compensation of multidimensional selective excitation pulses using measured k-space trajectories. *Magn. Reson. Med.* 34, 446–456 (1995).
13. N. G. Papadakis, A. A. Wilkinson, T. A. Carpenter, and L. D. Hall, A general method for measurement of the time integral of variant magnetic field gradients: application to 2D spiral imaging. *Magn. Reson. Imaging* 15, 567–578 (1997).
14. G. F. Mason, T. Harshbarger, H. P. Hetherington, Y. Zhang, G. M. Pohost, and D. B. Twieg, A method to measure arbitrary k-space trajectories for rapid MR imaging. *Magn. Reson. Med.* 38, 492–496 (1997).
15. A. B. Kerr, J. M. Pauly, C. H. Meyer, and D. G. Nishimura, Image quality for spiralbased sequence, in "Proc., SMR, 3rd Annual Meeting, Nice, 1995," p. 622.
16. A. B. Kerr, J. M. Pauly, and D. G. Nishimura, Gradient measurement and characterization for spiral and echo-planner sequences, in "Proc., ISMRM, 4th Annual Meeting, New York, 1996," p. 364.
17. J. I. Jackson, C. H. Meyer, D. G. Nishimura, and A. Macovski, Selection of a convolution function for Fourier inversion using gridding. *IEEE Trans. Med, Imaging* 10, 473–478 (1991).
18. D. C. Noll, C. H. Meyer, J. M. Pauly, D. G. Nishimura, and A. Macovski, A homogeneity correction method for magnetic resonance imaging with time-varying gradients. *IEEE Trans. Med. Imaging* 10, 629–637 (1991).
19. P. Irarrazabal, C. H. Meyer, D. G. Nishimura, and A. Macovski, Inhomogeneity correction using an estimated linear field map. *Magn. Reson. Med.* 35, 278–282 (1996).

What is claimed is:

1. A method of imagining an object using magnetic resonance imaging (MRI) signals comprising the steps of a) placing the object in a magnetic field, b) exciting nuclei spins in the object, c) applying magnetic gradients to the object, d) detecting MRI signals which traverse spirals in k-space, the step of applying magnetic gradients offsetting the spirals from a k-space origin whereby acquisition delay in k-space trajectories around the k-space origin shifts data samples approximately in parallel along the k-space trajectory, and e) using the detected MRI signals in imaging the object.

2. The method as defined by claim 1 wherein step e) includes correcting the detected MRI signals for delay in acquisition.

3. The method as defined by claim 2 wherein the offsetting of the spirals is effected by gradient waveforms having initial bipolar blips whose net areas determine the offset.

4. The method as defined by claim 1 wherein the offsetting of the spirals is effected by gradient waveforms having initial bipolar blips whose net areas determine the offset.

5. The method as defined by claim 1 wherein the MRI imaging is phase contrast.

6. The method as defined by claim 1 wherein the MRI imaging is projection reconstruction.

7. The method as defined by claim 1 wherein the offsetting of the spirals is effected by gradient waveforms having an initial blip whose area determines the offset.

8. The method as defined by claim 7 wherein step e) includes correcting for the detected MRI signals for linear phase due to offsetting the spirals.

9. The method as defined by claim 8 wherein the MRI imaging is phase contrast.

10. The method as defined by claim 8 wherein the MRI imaging is projection reconstruction.

* * * * *